United States Patent
Hagen

(10) Patent No.: US 10,063,238 B1
(45) Date of Patent: Aug. 28, 2018

(54) APPARATUS AND METHOD FOR A PERMUTATION SEQUENCER

(71) Applicant: QUALCOMM Incorporated, San Diego, CA (US)

(72) Inventor: Kelly Wong Hagen, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/707,689

(22) Filed: Sep. 18, 2017

(51) Int. Cl.
*H03K 19/177* (2006.01)

(52) U.S. Cl.
CPC . *H03K 19/17752* (2013.01); *H03K 19/17728* (2013.01)

(58) Field of Classification Search
CPC ....... H03K 19/17728; H03K 19/17752; H03K 19/20; H03K 19/21
See application file for complete search history.

(56) References Cited

U.S. PATENT DOCUMENTS

| | | | |
|---|---|---|---|
| 6,539,508 B1 | 3/2003 | Patrie et al. | |
| 6,879,139 B2 | 4/2005 | Brown et al. | |
| 7,174,014 B2 | 2/2007 | Lee et al. | |
| 7,287,148 B2 | 10/2007 | Kanapathippillai et al. | |
| 7,616,027 B2 | 11/2009 | Schmit et al. | |
| 2002/0078011 A1* | 6/2002 | Lee | G06F 7/762 |
| 2009/0157789 A1* | 6/2009 | Schuman | H03K 23/004 |
| | | | 708/620 |
| 2011/0267096 A1* | 11/2011 | Chlipala | G01R 31/31858 |
| | | | 326/16 |
| 2018/0062830 A1* | 3/2018 | Baker | H04L 9/0631 |

* cited by examiner

*Primary Examiner* — Jason M Crawford
(74) *Attorney, Agent, or Firm* — Loza & Loza, LLP/Qualcomm

(57) ABSTRACT

Aspects of the disclosure are directed to sequencing. In accordance with one aspect, sequencing includes creating a one hot list; selecting a current word of the one hot list as a one hot list output; comparing the one hot list output with a current accumulation register value of an accumulation register to produce a logical comparison; inputting the logical comparison to the accumulation register to generate an updated accumulation register value; and outputting the updated accumulated register state to a client unit to enable or disable the client unit.

16 Claims, 7 Drawing Sheets

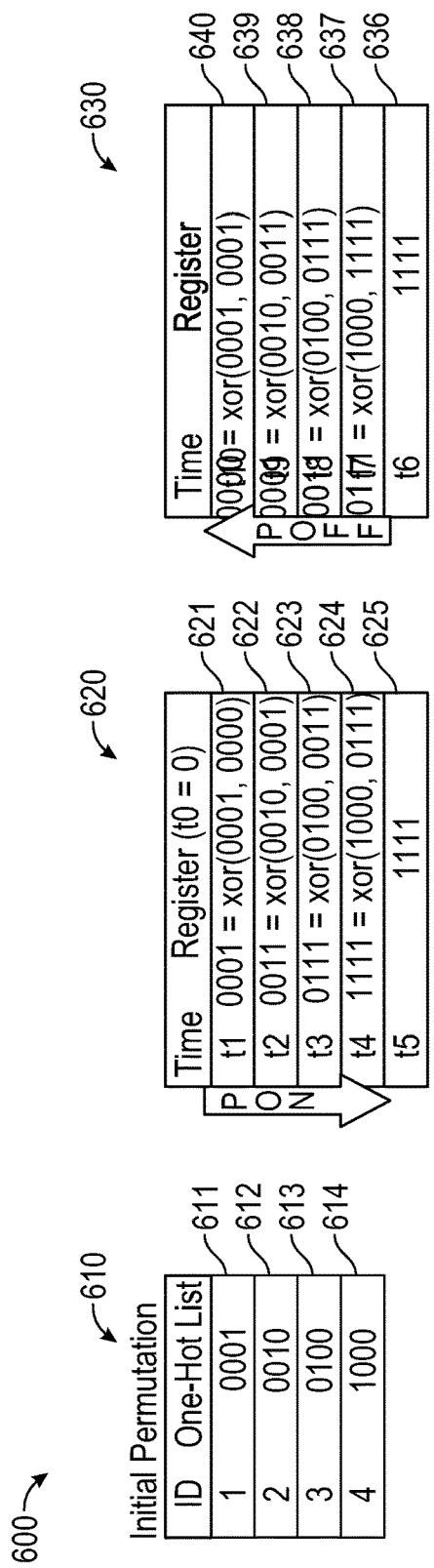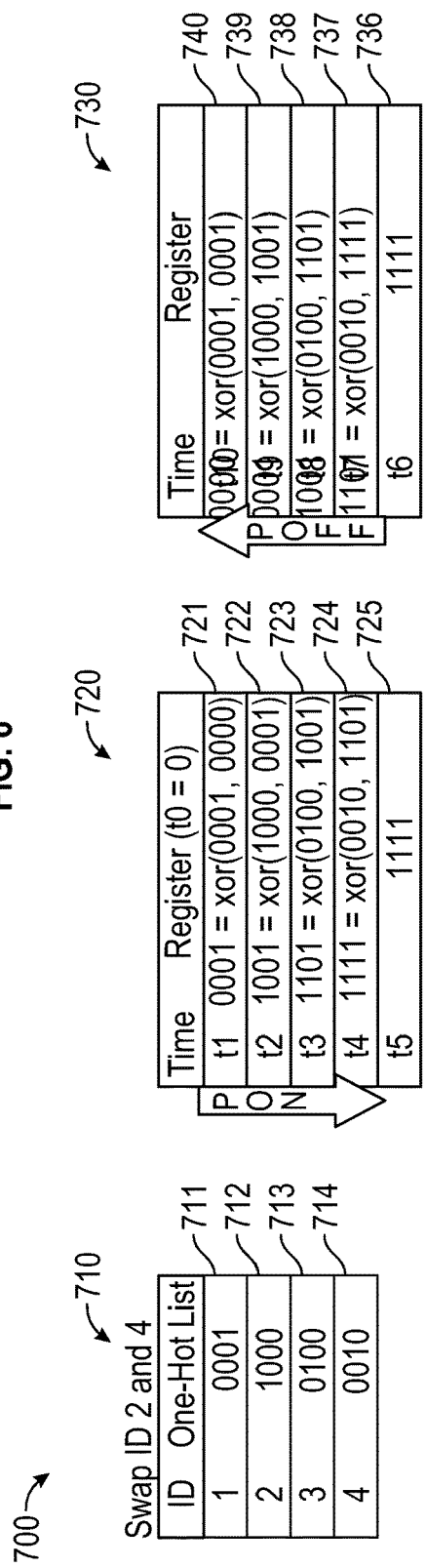
FIG. 6
FIG. 7

APPARATUS AND METHOD FOR A PERMUTATION SEQUENCER

TECHNICAL FIELD

This disclosure relates generally to the field of sequencers, and, in particular, to a permutation sequencer.

BACKGROUND

A sequencer is a controller to enable or disable a plurality of client units sequentially. That is, each client unit is powered up one at a time in a particular order. For example, client units may be power supplies in a system where each power supply is turned on in a power up sequence in a particular order of client unit enablement, i.e., in a permutation. Typically, the power down sequence is the inverse of the power up sequence. The power up sequence may include the transmission of an enable signal from the sequencer to each client unit and the reception of an acknowledgement (e.g. a power good signal) by the sequencer from each client unit. In addition, the power up sequence should maintain state, i.e., previously enabled client units should remain enabled as other client units are enabled in turn.

In conventional designs, the sequencer may be hard coded with specific logic to implement the power up sequence for a defined quantity of client units. Hard coding (e.g., in a programmable logic device, PLD) implies that changing the power up sequence may be difficult as the architecture changes over time. However, designs may require increased flexibility in sequencer operation by changing the permutation as client units are added, subtracted or swapped to the system. Thus, what is desired is a more generic and flexible sequencer architecture which is independent of the specific permutation desired.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a permutation sequencer. Accordingly, a permutation sequencer may include a one hot list with the one hot list including a one hot list output; an XOR logic coupled to the one hot list with the XOR logic including a first XOR input and a second XOR input; and an accumulation register coupled to the XOR logic with the accumulation register including an accumulation register output; and wherein the one hot list output is coupled to the first XOR input and the accumulation register output is coupled to the second XOR input. In one example, the accumulation register output is coupled to one or more client units. In one example, the permutation sequencer also includes a read pointer to address the one hot list.

In one example, the permutation sequencer also includes a power good register coupled to the accumulation register. The power good register is to implement a single bit interface to the accumulation register. The power good register stores an abstracted representation of actual client unit enable status of one or more client units. In one example, a content of the accumulation register and a content of the power good register are compared to generate an acknowledgement or a confirmation of an actual sequence state of one or more client units. In one example, the power good register is a mock register.

In one example, the permutation sequencer includes a logic module coupled to the power good register. The logic module may generate a bit sequence to input to the power good register. And, the bit sequence may represent the actual sequence state of the one or more client units. In one example, a quantity of the one or more client units is N quantity and the one hot list includes N quantity of words with each of the N quantity of words having a word length equal to N bits.

In one example, the one hot list includes a one hot encoded list and a shift register decoder, and the shift register decoder is coupled to the one hot encoded list. The quantity of the one or more client units is N quantity and the one hot encoded list includes N quantity of encoded words with each encoded word of the N quantity of encoded words having a word length of less than N bits. And, for example, the each encoded word of the N quantity of encoded words is encoded with binary encoding to reduce the number of bits per encoded word.

Another aspect of the disclosure provides a method for sequencing including selecting a current word of a one hot list as a one hot list output; comparing the one hot list output with a current accumulation register value of an accumulation register to produce a first logical comparison; and inputting the first logical comparison to the accumulation register to generate an updated accumulation register value. The method for sequencing may further include outputting the updated accumulated register state to one client unit of a plurality of client units to enable or disable the one client unit. In one example, a quantity of the plurality of client units is N quantity. The method of sequencing may further include creating the one hot list, wherein the one hot list includes N quantity of words. In one example, each word of the N quantity of words has a word length of N bits. In another example, each word of the N quantity of words has a word length of less than N bits. The method for sequencing may further include encoding each word of the N quantity of words. And, in one example, the encoding is binary encoding. In one example, the method for sequencing may further include generating a second logical comparison between a content of the accumulation register and a content of a power good register. And, in one example, the outputting the updated accumulated register state to the one client unit is based on the second logical comparison.

Another aspect of the disclosure provides an apparatus for sequencing, the apparatus including means for creating a one hot list; means for selecting a current word of the one hot list as a one hot list output; means for comparing the one hot list output with a current accumulation register value of an accumulation register to produce a first logical comparison; means for inputting the first logical comparison to the accumulation register to generate an updated accumulation register value; and means for outputting the updated accumulated register state to one client unit of a plurality of client units to enable or disable the one client unit. In one example, a quantity of the plurality of client units is N quantity and wherein the one hot list includes N quantity of words. In one example, each word of the N quantity of words has a word length of N bits. In another example, each word of the N quantity of words has a word length of less than N bits and each word is binary encoded.

Another aspect of the disclosure provides a computer-readable medium storing computer executable code, operable on a device including at least one processor and at least one memory coupled to the at least one processor, wherein the at least one processor is configured to implement sequencing, the computer executable code including: instructions for causing a computer to select a current word of a one hot list as a one hot list output; instructions for causing the computer to compare the one hot list output with a current accumulation register value of an accumulation register to produce a first logical comparison; and instructions for causing the computer to input the first logical comparison to the accumulation register to generate an updated accumulation register value. In one example, the computer-readable medium further includes instructions for causing the computer to output the updated accumulated register state to one client unit of a plurality of client units to enable or disable the one client unit.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 6 illustrates a first example of a successful operation of a permutation sequencer.

FIG. 7 illustrates a second example of a successful operation of the permutation sequencer.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

In a system architecture which includes a plurality of units, there may be two generic categories of units. A first unit category may be a server unit and a second unit category may be a client unit. For example, a hierarchy within the system architecture may be established where a server unit provides services or tasks for a client unit. One type of service may be an enabling or disabling service, that is, a service for enabling or disabling a client unit.

Figure 1:
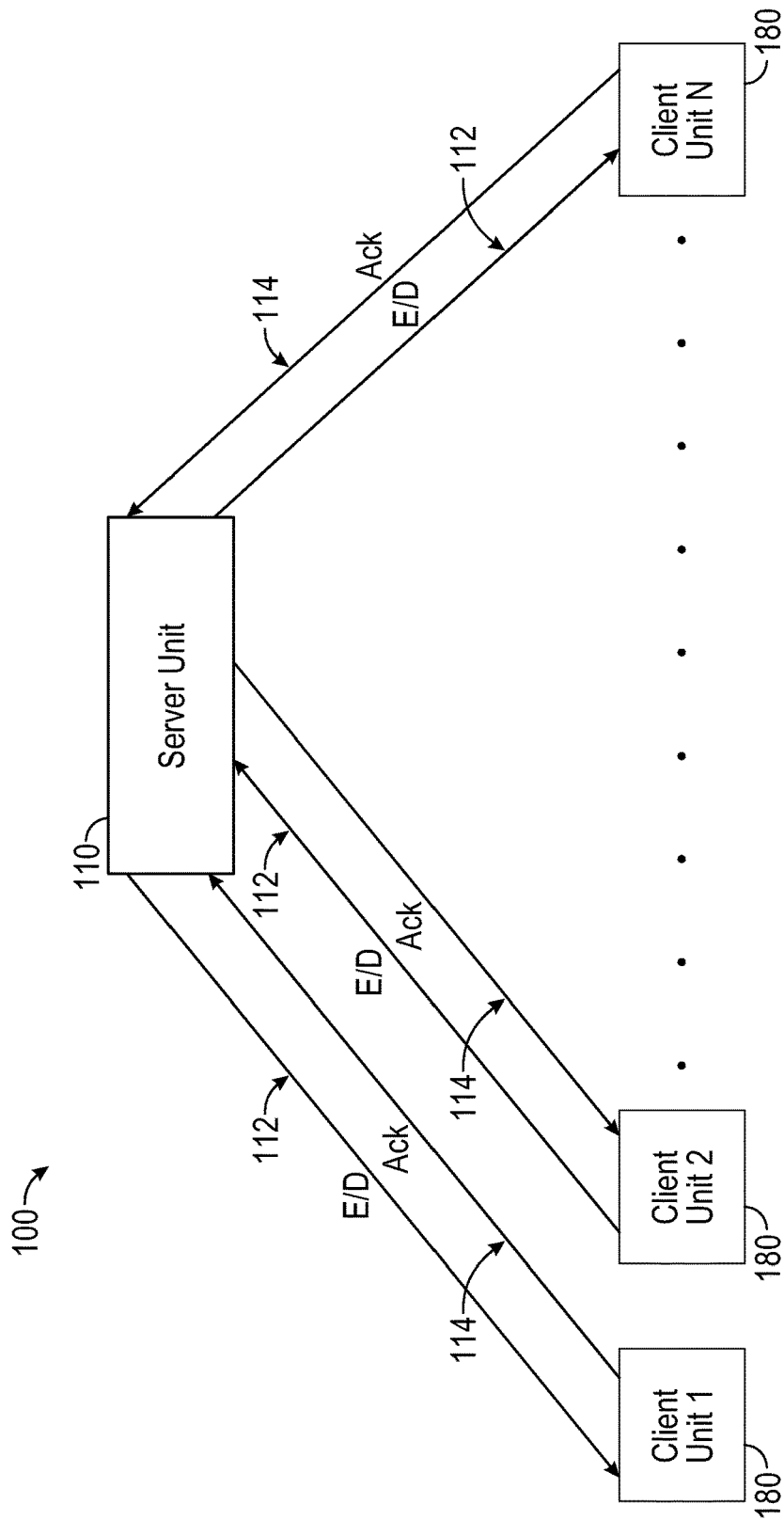
FIG. 1 illustrates an example system architecture with a plurality of client units and a server unit.

FIG. 1 illustrates an example system architecture 100 with a plurality of client units 180 and a server unit 110. As shown in the example of FIG. 1, there are N quantity of client units. Although in the example of FIG. 1, one server unit is shown, in other examples, there may be more than one server unit. In one example, each of the plurality of client units 180 may be enabled or disabled by the server unit 110 in a temporal order (i.e. sequentially). Between each client unit 180 and the server unit 110, there is an enablement/disablement (E/D) channel 112 and an acknowledgement channel 114. In one example, the server unit 110 enables or disables the client unit 180 by sending an enable command or a disable command through the enablement/disablement channel to the client unit 180. In one example, after receipt of the enable command or the disable command, the client unit 180 acknowledges by sending an acknowledgement to the server unit 110 through the acknowledgement channel 114.

In one example, a permutation sequencer may be server unit or a controller to enable or disable a plurality of client units sequentially. In the example shown in FIG. 1, the server unit 110 is one example of a permutation sequencer. For example, each client unit may be powered up one at a time in a particular temporal order. For example, client units may be power supplies in a system where each power supply is turned on in a power up sequence in a particular temporal order of client unit enablement, i.e., in a permutation. In one example, permutation means a specific ordering. Typically, a power down sequence of the client units (e.g., power supplies) is in the inverse order of the power up sequence. The power up sequence may include the transmission of an enable signal from the permutation sequencer to each client unit and the reception of an acknowledgement (e.g., a power good signal) by the permutation sequencer from each client unit. In one example, the enable signal may be a specific bit from an accumulation register in the permutation sequencer. In addition, the power up sequence maintains state. Maintaining state means that the previously enabled client units remain enabled as other client units are enabled in turn.

In accordance with the present disclosure, a permutation sequencer may provide a generic and flexible architecture to allow an arbitrary permutation of client unit enablement using simple bit level processing. Key elements of the permutation sequencer may include one or more of the following: a one hot list, Exclusive OR (XOR) logic, and/or a finite state machine (FSM) with an accumulation register. A FSM is a sequential logic function, with a finite number of states, which sequentially transitions to an updated state based on a current state and current input. The permutation sequencer may implement a permutation for client unit power ON sequencing using built-in acknowledgment and accumulation.

Figure 2:
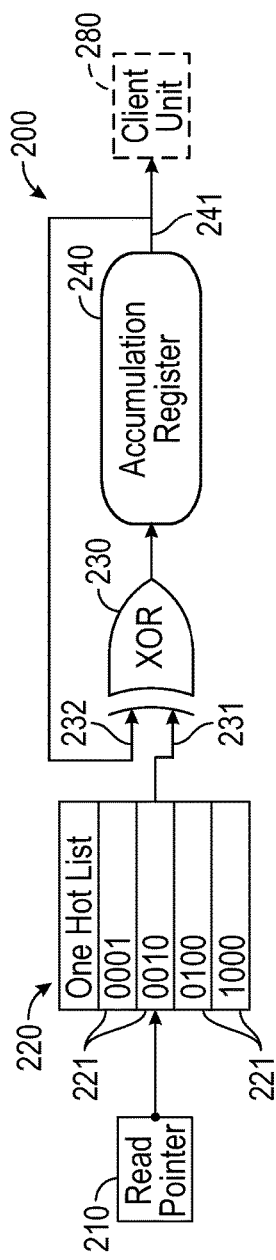
FIG. 2 illustrates an example permutation sequencer for enabling or disabling client units.

FIG. 2 illustrates an example permutation sequencer 200 for enabling or disabling client units 280. The client unit 280 is not part of the permutation sequencer 200 and is thus shown as dashed lines. Although only one client unit 280 is shown, in some examples, more than one client units 280 are coupled to the permutation sequencer 200. As shown in the example of FIG. 2, the permutation sequencer 200 includes a read pointer 210, a one hot list 220, an XOR logic 230 and an accumulation register 240. In one example, the one hot list 220 includes one or more hot list words 221.

In one example, the read pointer 210 may be an address register for addressing a memory location. In one example, the one hot list 220 may be a memory or register for storing permutation words. In one example, a permutation word may have a word length of N bits. For example, the read pointer 210 may address the one hot list 220. The read pointer 210, for example, may address the one hot list 220 to produce a selected one hot list word 221 at an output of the one hot list 220. The output of the one hot list may be referred to as a one hot list output.

In one example, the one hot list 220 may use one hot bit encoding for permutation option encoding. For example, one hot bit encoding is a form of state encoding where the word length N is the same as the number of states. In one example, N is also the quantity of client units 280. The one hot list 220 may be a register array with a plurality of N bit words where a single bit out of the N bit word is set to logical level HIGH ("1") and the remaining bits are all set to logical level LOW ("0"), hence the terminology "one hot". The one hot bit encoding may be used to identify each client unit 280 uniquely in the one hot list 220 with only one HIGH bit per register word. That is, each register word is orthogonal to the other register words. The HIGH bit may also represent an acknowledgement and/or a mask for power ON confirmation. The one hot list may be created by a write command to memory space, a write command to registers, initialization values in registers or initialization constants at build-time. In one example, if a quantity of one or more client units 280 is N quantity, then the one hot list 220 includes N quantity of words with each of the N quantity of words having a word length equal to N bits.

In another example, the one hot list 220 is implemented by a one hot encoded list coupled to a shift register decoder. In an example where the quantity of client units is N, the one hot encoded list includes an N quantity of encoded words with each encoded word having less than N bits per encoded word. In the one hot encoded list, each encoded word is encoded with binary encoding to reduce the number of bits per encoded word. Although binary encoding is disclosed, one skilled in the art would understand that other forms of encoding (such as but not limited to ternary encoding, complementary binary encoding, complementary ternary encoding, etc.) may be used within the scope and spirit of the present disclosure. In one example, the shift register decoder decodes the encoded words of the one hot encoded list to generate a list of words consistent with the words of the one hot list 220 without encoding.

The XOR logic 230 may follow the one hot list 220 with two inputs, a first XOR input 231 and a second XOR input 232. For example, the first XOR input 231 and the second XOR input 232 each have a word length of N bits. In one example, the first XOR input is connected to the selected one hot list word 221 at the output of the one hot list 220. An output of the XOR logic 230 is a logical exclusive OR combination of the first XOR input 231 and the second XOR input 232. In one example, the logical exclusive OR combination of two XOR inputs 231, 232 produces a logical HIGH output if the first XOR input 231 and the second XOR input 232 are set to different logical states (i.e., one XOR input is HIGH and the other XOR input is LOW). And, the logical exclusive OR combination of two XOR inputs 231, 232 produces a logical LOW output if both the first XOR input 231 and the second XOR input 232 are set to the same logical state (i.e., both XOR inputs are HIGH or both XOR inputs are LOW). For example, the output of the XOR logic 230 has a word length of N bits. In one example, the XOR logic 230 implements a logical exclusive OR combination of two N bit XOR inputs to produce an N bit XOR output.

In one example, the output of the XOR logic 230 is connected to an input of an accumulation register 240. The accumulation register 240 stores the current state of the output of the XOR logic 230 as a current accumulation register value. For example, an output of the accumulation register 241 is connected to the second XOR input 232 of the XOR logic 230. In one example, the output of the accumulation register 241 is referred to as an accumulation register output. In one example, the accumulation register 240 is part of a finite state machine (FSM). In one example, the accumulation register 240 updates the current accumulation register value to yield an updated accumulation register value. The accumulation register 240 may operate as a higher-level manager for the permutation sequencer 200. For example, the accumulation register 240 may operate independently of the specific contents of the one hot list.

The operation of the permutation sequencer 200 may be represented by a repeating sequence of register value transitions. In one example, a register value transition is a logical progression from one value to another value. For example, a current accumulation register value may transition to an updated accumulation register value. For example, the accumulation register 240 may implement a recurring relationship between the current accumulation register value and the updated accumulation register value represented mathematically as:

$$r(k+1)=\text{XOR}\{r(k),p(k)\}$$

where k=permutation index, r(k)=current accumulation register value at current permutation index k r(k+1)=updated accumulation register value at updated permutation index k+1 p(k)=current state of selected one hot list word at current permutation index k

In one example, the XOR logic 230 implements the permutation progressively and reverses the permutation automatically. Note that in one example, the XOR logic is the only logical operation which implements automatic permutation reversal. Also, the XOR logic 230 maintains enable state for all the client units 280. That is, an enable state with N bits is incrementally updated with one bit transition per event. The permutation is implemented solely by the one hot list 220 and the XOR logic 230 without the need for hardware modification.

The current accumulation register value is used to execute the power ON/power OFF sequence. Also, an acknowledgement or a confirmation of an actual sequence state may be performed by the accumulation register 240 using a logical comparison of the accumulation register 240 with a power good register. In another embodiment, the acknowledgement may be optional. In one example, an actual sequence state is the enable or disable status of one or more client units.

Figure 3:
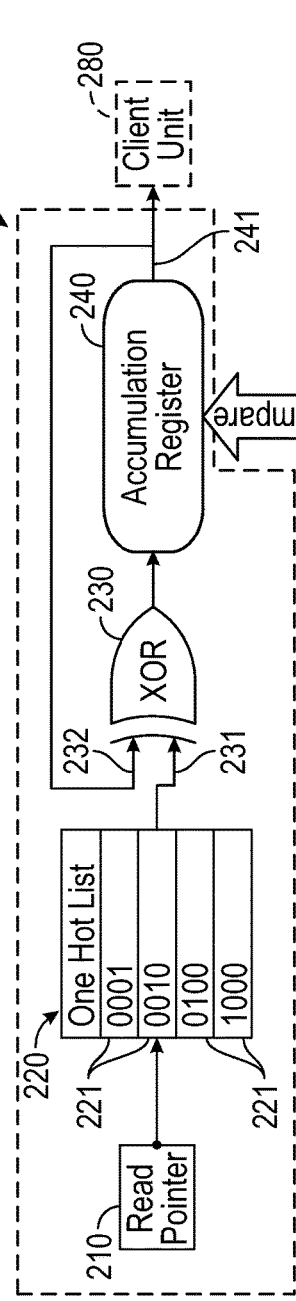
FIG. 3 illustrates an example system which includes a permutation sequencer coupled to an acknowledgement comparison logic.

FIG. 3 illustrates an example system 300 which includes a permutation sequencer 200 coupled to an acknowledgement comparison logic 310. In one example, the acknowledgement comparison logic 310 includes a power good register 350 and a logic module 360. Although only one logic module is shown in FIG. 3, more than one logic modules may be implemented as needed by a specific design and/or for a specific application.

In one example, the permutation sequencer 200 may be implemented with the acknowledgement comparison logic 310 incorporated as shown in FIG. 3. In addition to the read pointer 210, the one hot list 220, the XOR logic 230 and the accumulation register 240 which are already described in reference to FIG. 2, a power good register 350 may be included in the system 300. The power good register 350 may be used to implement an N-bit interface to the accumulation register 240 such that implementation details of other logic modules may be abstracted from the system 300. In one example, each client unit's acknowledgement may be reduced to a single bit representation. An example logic module 360 is shown schematically in FIG. 3. The logic module 360 in FIG. 3 could include combinational logic, such as but not limited to one or more of the following: inverter, AND gates, OR gates, NAND gates, XOR gates, etc. One skilled in the art would understand that the example components of the logic module 360 shown in FIG. 3 may be replaced by other components and still be within the scope and spirit of the present disclosure. The particular components of the logic module 360 are governed by a particular design or a particular application need. In one example, the logic module 360 generates a bit sequence to input to the power good register 350 wherein the bit sequence represents the actual sequence state of the one or more client units 280. In one example, the contents of accumulation register 240 and the contents of power good register 350 may be compared to provide (i.e., generate) an acknowledgement or a confirmation of the actual sequence state.

In one example, if no explicit acknowledgement is required, a "mock register" may be substituted for the power good register 350 with no changes to the accumulation register 240 required. That is, in one example, the FSM operates the same with or without a mock register. In one example, the acknowledgement comparison logic 310 includes a mock register (not shown) without the logic module 360. In one example, the mock register is a register with content that reflects the value of the accumulation register, i.e., a desired state. In providing a mock register, the comparison between the accumulation register 240 and the mock register would always match. In the example of implementing the mock register, since the comparison between the accumulation register 240 and the mock register always matches, he confirmation is always successful. In one example, the FSM and the one hot list 220 (which includes permutation words) are modular.

Figure 4:
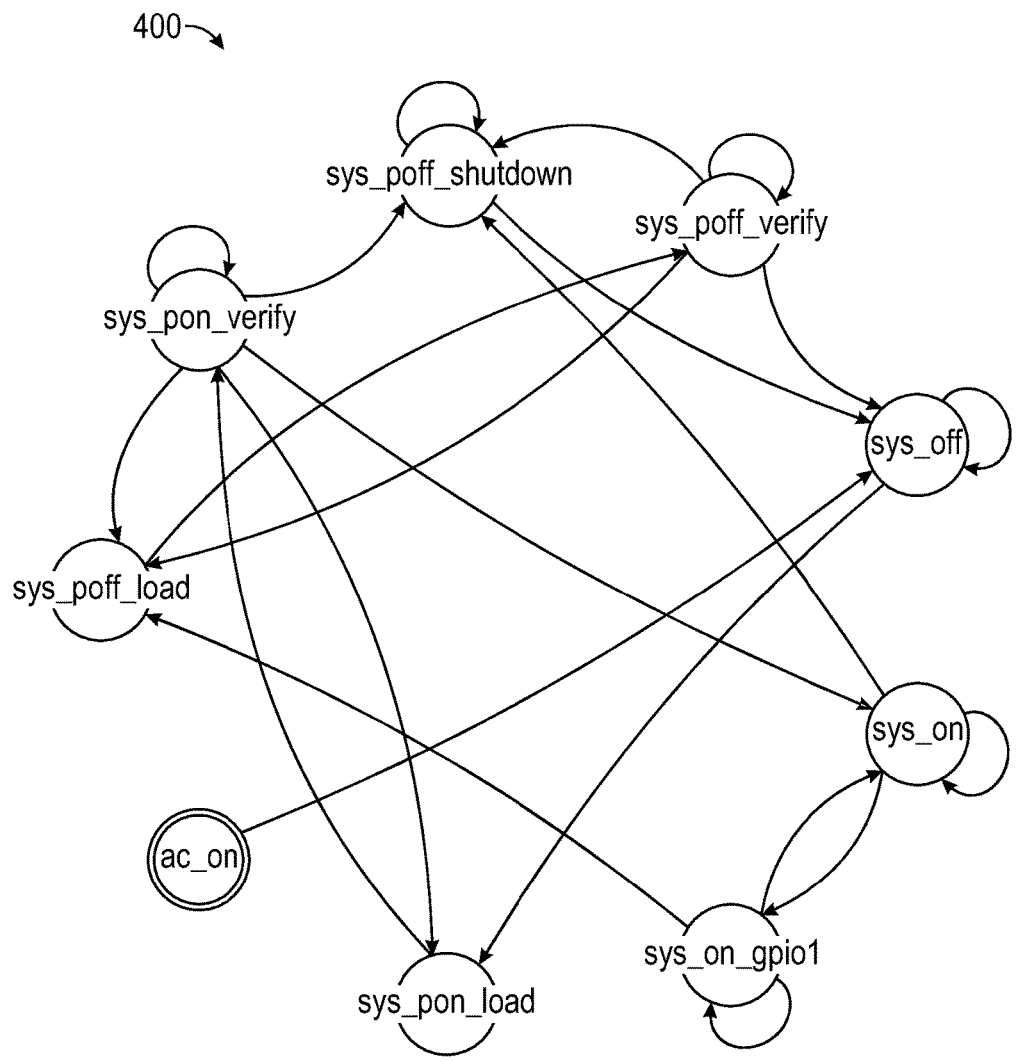
FIG. 4 illustrates an example finite state machine (FSM) for a permutation sequencer with M=9 states.

FIG. 4 illustrates an example finite state machine (FSM) 400 for a permutation sequencer with M=9 states. In one example, the FSM remains at M=9 states independent of the value N of client units in the one hot list.

Figure 5:
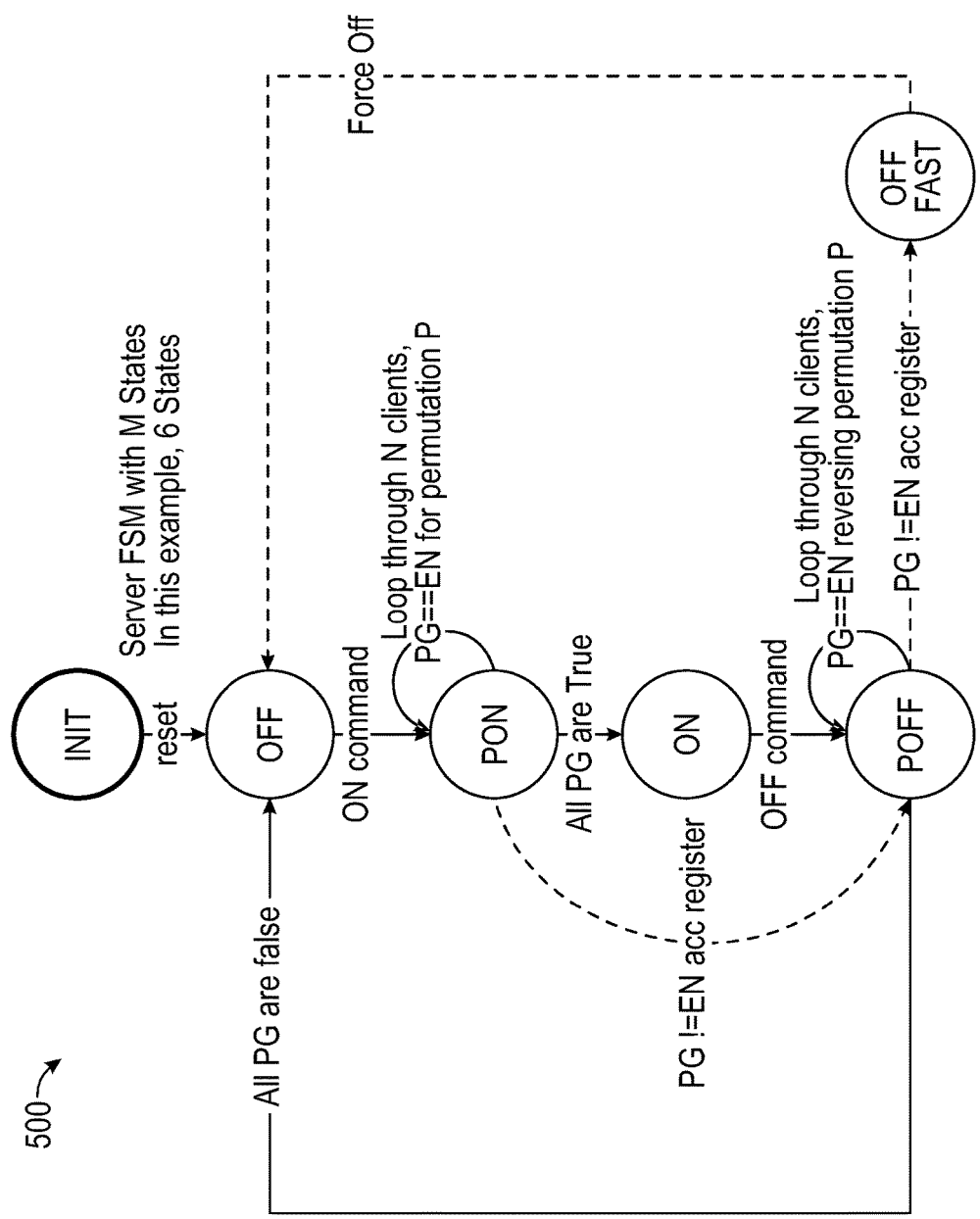
FIG. 5 illustrates an example of a simplified finite state machine (FSM) for a permutation sequencer with M=6 states, N client units and a P permutation list.

FIG. 5 illustrates an example of a simplified finite state machine (FSM) 500 for a permutation sequencer with M=6 states, N client units and a P permutation list. In one example, a first state is an initial state INIT which proceeds to a second state which is an OFF state, after a reset. Next, a third state is an PON state after receipt of an ON command.

In one example, the FSM loops through N client units while remaining in the PON state as long as an accumulation register agrees with a power good register and until the end of the permutation list is reached. After the FSM loops are completed, if the accumulation register agrees with the power good register, then proceed to a fourth state which is an ON state. In one example, the ON state represents a state where all client units are enabled. Next, after receipt of an OFF command, proceed to a fifth state which may be a POFF state. In one example, the FSM loops through N client units while remaining in the POFF state as long as an accumulation register agrees with a power good register and until the end of the permutation list is reached. After the FSM loops are completed, if the accumulation register agrees with the power good register, then proceed to the second state which is the OFF state. In one example, the OFF state represents a state where all client units are disabled.

In one example, while in the third state (e.g. PON state), after the FSM loops are completed, if the accumulation register disagrees with the power good register, then proceed to the fifth state which is the POFF state. Next, while in the fifth state (e.g. POFF state), if the accumulation register disagrees with the power good register, then proceed to a sixth state. In one example, the sixth state is an OFF FAST state which enables a force off command. In one example, after receipt of the force off command, proceed to the second state which is the OFF state.

In one example, PON is a "power on" state and POFF is a "power off" state, where these states occur while the FSM reads values from the one hot list. Also, ON is an "on" state and OFF is an "off" state, where these states occur while the FSM does not read values from the one hot list. In one example, PON is short for "Power On" and POFF is short for "Power Off" are the server states where the FSM is reading out the values from the permutation one-hot list, updating the XOR accumulation register and waiting for the PG to propagate back to test for equality. For all other states, the FSM does not read out the contents of the permutation one-hot list and the XOR accumulation register does not change value. For example, PON starts with the read pointer at 0 and INCREMENTS it until the last value is reached or there is a failure whereas POFF starts with the read pointer at wherever PON left it and DECREMENTS it until it reaches 0 or there is a failure. In a successful sequence, PON reads out the permutation from 0 to N and POFF reads out the permutation from N to 0. In an unsuccessful permutation, PON reads from 0 to N–x where N–x fails and POFF reads from N–x to 0, where x is an integer<N. In an unsuccessful fast off permutation, PON reads from 0 to N–x and POFF reads from N–x and eventually jumps to 0.

FIG. 6 illustrates a first example 600 of a successful operation of a permutation sequencer. In example 600, Table 610 is a one hot list with four words and each word having 4 bits in a first permutation for four client units. The content of a first enable register is shown in Table 620. In one example, the first enable register is the accumulation register 240 (shown in FIG. 2). The accumulation register 240 may be part of a finite state machine (FSM).

In one example, the first enable register exhibits a power ON sequence (PON) as a function of time. For example, a first entry (represented in row 621) of the first enable register at time t1 (shown in Table 620) is determined by an XOR logic (e.g., XOR logic 230) of a first word 611 of the one hot list (shown in Table 610) and an initial entry of zero to produce a first state value of "0001".

A second entry (represented in row 622) of the first enable register at time t2 (shown in Table 620) is determined by the XOR logic (e.g., XOR logic 230) of a second word 612 of the one hot list (shown in Table 610) and the first entry 621 to produce a second state value of "0011". A third entry (represented in row 623) of the first enable register at time t3 (shown in Table 620) is determined by the XOR logic (e.g., XOR logic 230) of a third word 613 of the one hot list (shown in Table 610) and the second entry (represented in row 622) to produce a third state value of "0111". A fourth entry 624 of the first enable register at time t4 (shown in Table 620) is determined by the XOR logic (e.g., XOR logic 230) of a fourth word 614 of the one hot list (shown in Table 610) and the third entry (represented in row 623) to produce a fourth state value of "1111". The power on sequence continues in this manner until a fifth state value of "1111" for a fifth entry (represented in row 625) of the first enable register at time t5 is produced. The fifth state value is the same as the fourth state value. In one example, the fifth state indicates that all four client units are enabled or powered ON.

The content of a second enable register is shown in Table 630. In one example, the second enable register is the accumulation register 240 (shown in FIG. 2). The accumulation register 240 may be part of a finite state machine (FSM). In one example, the first enable register and the second enable register are the same accumulation register 240. In one example, a second enable register exhibits a power OFF sequence (POFF) as a function of time. For example, a sixth entry (represented in row 636) of the second enable register at time t6 has the fifth state value of "1111". A seventh entry (represented in row 637) of the second enable register at time t7 is determined by an XOR logic (e.g., XOR logic 230) of a fourth word 614 of the one hot list shown in Table 610 and the sixth entry (represented in row 636) to produce a seventh state value of "0111".

An eighth entry (represented in row 638) of the second enable register at time t8 is determined by the XOR logic (e.g., XOR logic 230) of a third word 613 of the one hot list shown in Table 610 and the seventh entry (represented in row 637) to produce an eighth state value of "0011". A ninth entry (represented in row 639) of the second enable register at time t9 is determined by the XOR logic (e.g., XOR logic 230) of a second word 612 of the one hot list shown in Table 610 and the eighth entry (represented in row 638) to produce a ninth state value of "0001". The power off sequence continues in this manner until a tenth state value of "0000" for a tenth entry 640 of the second enable register at time t10 is produced. In one example, the tenth state indicates that all four client units are disabled or powered OFF.

FIG. 7 illustrates a second example 700 of a successful operation of the permutation sequencer. In example 700, Table 710 is a one hot list with four words and each word having 4 bits in a second permutation for four client units. In one example, the second permutation is different from the first permutation illustrated in FIG. 6 by swapping client ID 2 with client ID 4. In one example, only the one hot list is modified with all other elements unchanged from FIG. 6. The content of a first enable register is shown in Table 720. In one example, the first enable register is the accumulation register 240 (shown in FIG. 2). The accumulation register 240 may be part of a finite state machine (FSM). The first enable register exhibits a power ON sequence (PON) as a function of time. For example, a first entry (represented in row 721) of the first enable register at time t1 is determined by an XOR logic (e.g., XOR logic 230) of a first word 711 of the one hot list (shown in Table 710) and an initial entry of zero to produce a first state value of "0001".

A second entry (represented in row 722) of the first enable register at time t2 is determined by the XOR logic (e.g., XOR logic 230) of a second word 712 of the one hot list (shown in Table 710) and the first entry (represented in row 721) to produce a second state value of "1001". A third entry (represented in row 723) of the first enable register at time t3 is determined by the XOR logic (e.g., XOR logic 230) of a third word 713 of the one hot list (shown in Table 710) and the second entry (represented in row 722) to produce a third state value of "1101". A fourth entry (represented in row 724) of the first enable register at time t4 is determined by the XOR logic (e.g., XOR logic 230) of a fourth word 714 of the one hot list (shown in Table 710) and the third entry (represented in row 723) to produce a fourth state value of "1111". The power ON sequence continues in this manner until a fifth state value of "1111" for a fifth entry 725 of the first enable register at time t5 is produced. The fifth state value is the same as the fourth state value. In one example, the fifth state indicates that all four client units are enabled or powered ON.

The content of a second enable register is shown in Table 730. In one example, the second enable register is the accumulation register 240 (shown in FIGS. 2 & 3). The accumulation register 240 may be part of a finite state machine (FSM). In one example, the first enable register and the second enable register are the same accumulation register 240. In one example, the second enable register exhibits a power OFF sequence (POFF) as a function of time. For example, a sixth entry (represented in row 736) of the second enable register at time t6 has the fifth state value of "1111".

A seventh entry (represented in row 737) of the second enable register at time t7 is determined by an XOR logic (e.g., XOR logic 230) of a fourth word 714 of the one hot list (shown in Table 710) and the sixth entry (represented in row 736) to produce a seventh state value of "1101". An eighth entry (represented in row 738) of the second enable register at time t8 is determined by the XOR logic (e.g., XOR logic 230) of a third word 713 of the one hot list (shown in Table 710) and the seventh entry (represented in row 737) to produce an eighth state value of "1001". A ninth entry (represented in row 739) of the second enable register at time t9 is determined by the XOR logic (e.g., XOR logic 230) of a second word 712 of the one hot list (shown in Table 710) and the eighth entry (represented in row 738) to produce a ninth state value of "0001". The power off sequence continues in this manner until a tenth state value of "0000" for a tenth entry (represented in row 740) of the second enable register at time t10 is produced. In one example, the tenth state indicates that all four client units are disabled or powered OFF.

Figure 8:
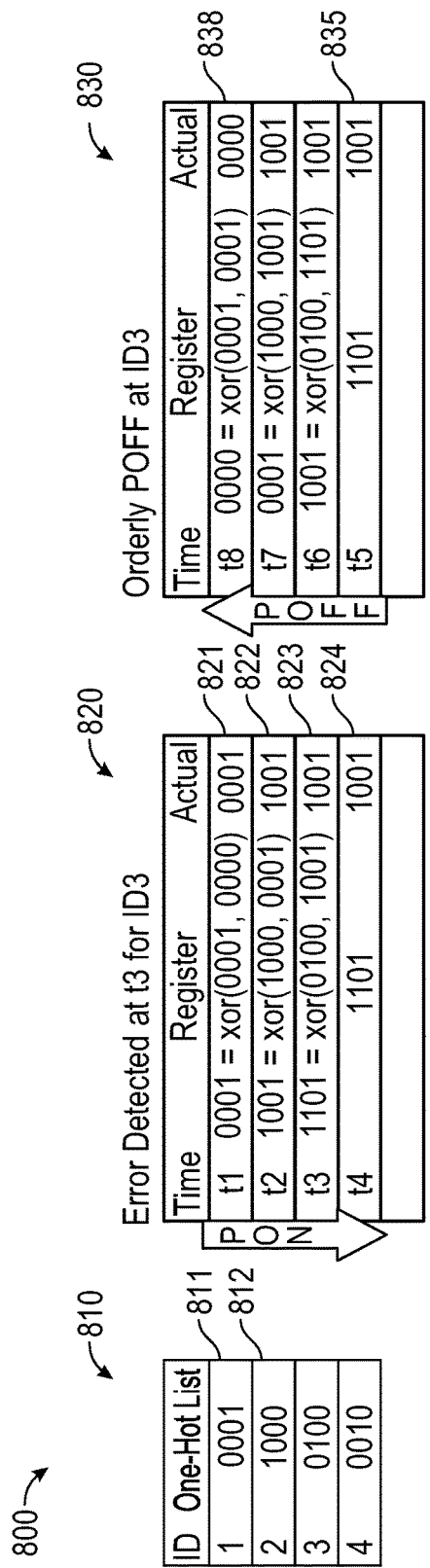
FIG. 8 illustrates a first example of an error detection operation of the permutation sequencer.

FIG. 8 illustrates a first example 800 of an error detection operation of the permutation sequencer. In example 800, Table 810 is a one hot list with four words and each word having 4 bits in a third permutation for four client units. The content of a first enable register is shown in Table 820. In one example, the first enable register is the accumulation register 240 (shown in FIG. 2). The accumulation register 240 may be part of a finite state machine (FSM). In one example, the first enable register exhibits a power ON sequence (PON) as a function of time.

In one example, a first entry (represented in row 821) of the first enable register at time t1 is determined by an XOR logic (e.g., XOR logic 230) of a first word 811 of the one hot list (shown in Table 810) and an initial entry of zero to produce a first state value of "0001". A second entry (represented in row 822) of the first enable register at time t2 is determined by the XOR logic (e.g., XOR logic 230) of a second word 812 of the one hot list (shown in Table 810) and the first entry (represented in row 821) to produce a second state value of "1001".

However, in example 800, a third entry (represented in row 823) of the first enable register at time t3 should be determined by the XOR logic (e.g., XOR logic 230) of a third word 813 of the one hot list (shown in Table 810) to have a value "0100" and the second entry (represented in row 822) to have a value "1001" to produce a correct third state value of "1101". Instead, due to an error condition, an errored third state value of "1001" (shown in row 823) is produced. In one example, a fourth entry (represented in row 824) of the first enable register at time t4 has an errored fourth state value equal to the errored third state value of "1001" (shown in row 824). Since the state transitions of the first enable register should incorporate one and only one bit change, the permutation sequencer may easily detect the error condition and transition to a power down sequence.

The content of a second enable register is shown in Table 830. In one example, the second enable register is the accumulation register 240 (shown in FIGS. 2 & 3). The accumulation register 240 may be part of a finite state machine (FSM). In one example, the first enable register and the second enable register are the same accumulation register 240.

The second enable register 830 exhibits a power OFF sequence (POFF) as a function of time, starting with a fifth entry (represented in row 835) of the second enable register having a value of "1001" which is equal to the errored fourth state value. In one example, the power down sequence proceeds orderly until an eighth state value of "0000" for an eighth entry (shown in row 838) of the second enable register at time t8 is produced. In one example, the eighth state indicates that all four client units are disabled or powered OFF.

Figure 9:
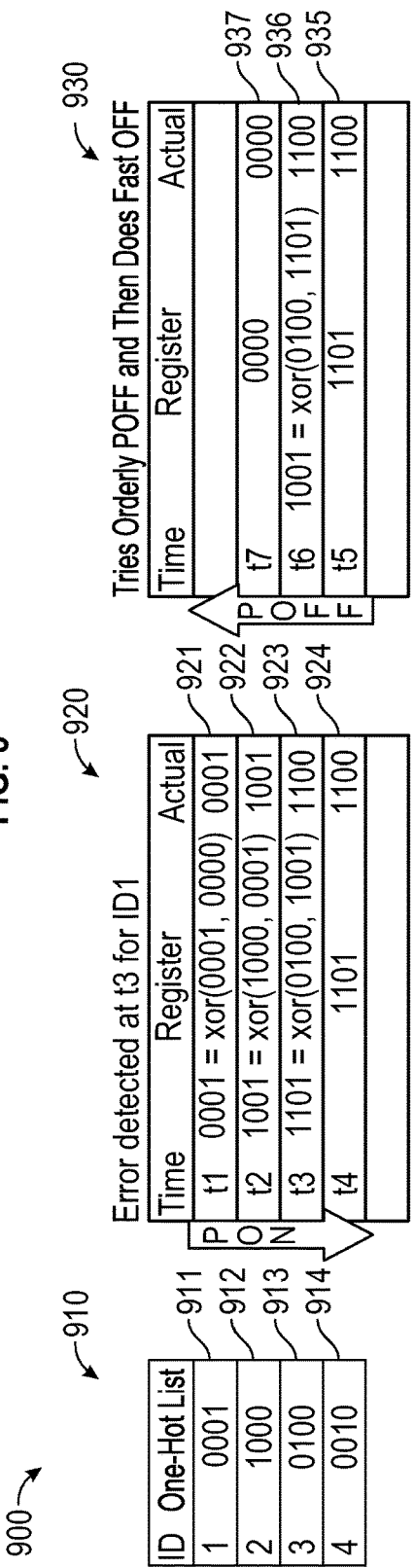
FIG. 9 illustrates a second example of an error detection operation of the permutation sequencer.

FIG. 9 illustrates a second example 900 of an error detection operation of the permutation sequencer. In example 900, Table 910 is a one hot list with four words and each word having 4 bits in a third permutation for four client units. The content of a first enable register is shown in Table 920. In one example, the first enable register is the accumulation register 240 (shown in FIG. 2). The accumulation register 240 may be part of a finite state machine (FSM).

In one example, the first enable register exhibits a power ON sequence (PON) as a function of time. For example, a first entry (represented in row 921) of the first enable register at time t1 is determined by an XOR logic (e.g., XOR logic 230) of a first word 911 of the one hot list (shown in Table 910) and an initial entry of zero to produce a first state value of "0001".

A second entry (represented in row 922) of the first enable register at time t2 is determined by the XOR logic (e.g., XOR logic 230) of a second word 912 of the one hot list (shown in Table 910) and the first entry (represented in row 921) to produce a second state value of "1001". However, in this example, a third entry (shown in row 923) of the first enable register at time t3 should be determined by the XOR logic (e.g., XOR logic 230) of a third word 913 of the one hot list (shown in Table 910) to have a value "0100" and the second entry (represented in row 922) to have a value "1001" to produce a correct third state value of "1101". Instead, due to an error condition, an incorrect third state value of "1100" (shown in row 923) is produced.

In example 900, a fourth entry (shown in row 924) of the first enable register at time t4 has an incorrect fourth state value equal to the incorrect fourth state value of "1100". Since the state transitions of the first enable register should incorporate one and only one bit change, the permutation sequencer may easily detect the error condition and transition to a power down sequence.

The second enable register 930 exhibits a power OFF sequence (POFF) as a function of time, starting with a fifth entry 935 of the second enable register to have a desired value of "1101" and an actual value of "1100", equal to the incorrect fourth state value. In one example, the XOR operation in the accumulation register yields a value of "1001", but the client unit responds incorrectly with a value of "1100". As a result of this failed comparison, the FSM may time out and perform a fast force off. In one example, the power down sequence proceeds quickly until a seventh state value of "0000" for a seventh entry (shown in row 937) of the second enable register at time t7 is produced. In one example, the seventh state indicates that all four client units are disabled or powered OFF. In one example, proceeds quickly means jumping directly to all zero values as soon as the timeout is reached.

Figure 10:
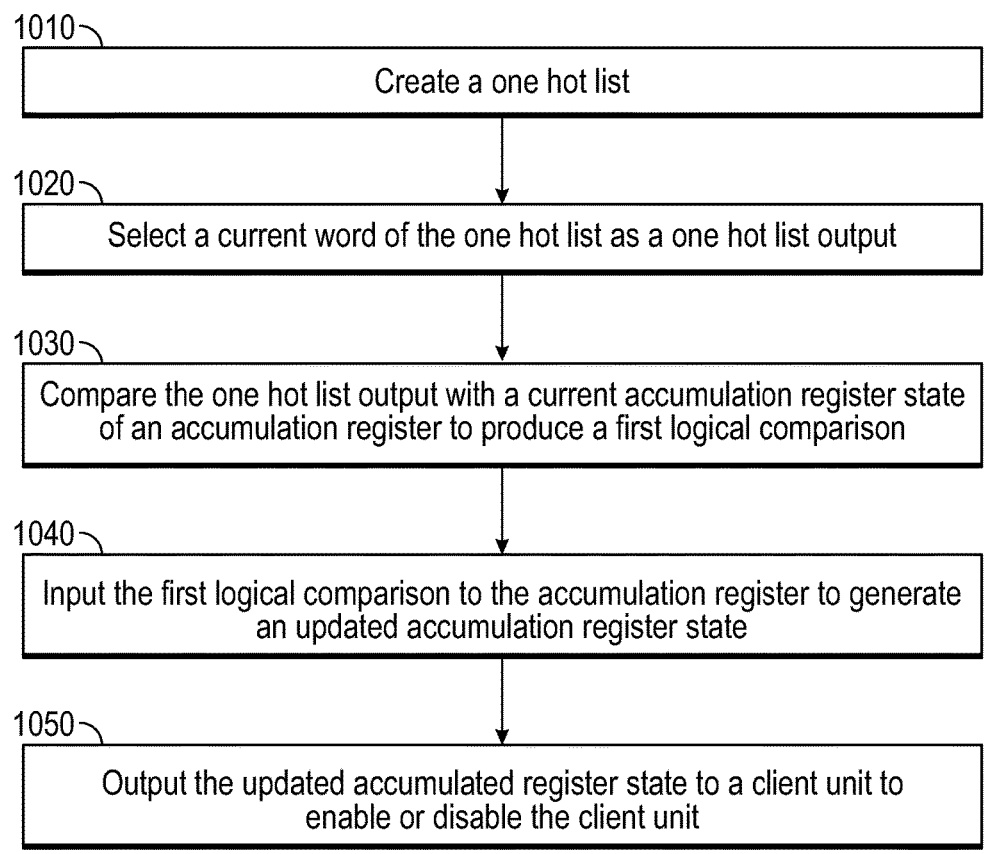
FIG. 10 illustrates an example flow diagram for a permutation sequencer operation.

FIG. 10 illustrates an example flow diagram 1000 for a permutation sequencer operation. In block 1010, create a one hot list. In one example, the words in the one hot list correspond to a permutation sequence. A permutation sequence is a temporal order of client unit enablement, i.e., the temporal order of powering ON client units. In one example, the permutation sequencer may have a timeout feature where a finite amount of time may be allocated for propagation time to the client units and acknowledgement time from the client units. In one example, the client units may be power supplies. One skilled in the art would understand that client units may include any device or any component of a device that may be powered ON or a powered OFF. In one example, the one hot list uses one hot bit encoding for state encoding. For example, the one hot list has a word length equal to a quantity N of client units. That is, the word length is N and the quantity of client units is also N. Wherein, if a quantity of one or more client units 280 is N quantity, then the one hot list 220 includes N quantity of words with each of the N quantity of words having a word length equal to N bits. The one hot bit encoding may be used to identify each client unit uniquely in the one hot list with only one HIGH bit per permutation word. In one example, the one hot list is created by a processor, wherein the processor may be coupled to a memory for storing information relating to the one hot list. The processor may be programmable.

In block 1020, select a current word of the one hot list as a one hot list output. In one example, the one hot list output has N bits. The selection may be performed by a read pointer (e.g., read pointer 210 shown in FIGS. 2 & 3).

In block 1030, compare the one hot list output with a current accumulation register value of an accumulation register to produce a first logical comparison. In one example, the first logical comparison is performed using an XOR logic (e.g., XOR logic 230 shown in FIGS. 2 & 3). In one example, the first logical comparison compares N bits, corresponding to the number of client units. In one example, a processor is used to compare the one hot list output with the current accumulation register value to produce the first logical comparison. The processor may or may not be the same processor that creates the one hot list in block 1010.

In block 1040, input the first logical comparison to the accumulation register (e.g., accumulation register 240 shown in FIGS. 2 & 3) to generate an updated accumulation register value. In one example, the updated accumulation register has N bits which correspond to the N quantity of client units. In one example, the updated accumulated register state is generated by an XOR logic (e.g., XOR logic 230) on the current accumulation register value and the one hot list output.

In block 1050, output the updated accumulated register state to a client unit to enable the client unit. In one example, the client unit is a power supply. In one example, the accumulation register outputs the updated accumulated register state to the client unit. In one example, the enablement may depend on an acknowledgement. The acknowledgement may be based on a second logical comparison between the content of the accumulation register (e.g., accumulation register 240 and the content of the power good register shown in FIG. 3). In a first example, the power good register 350 stores actual client unit enablement status. In a second example, the power good register 350 stores an abstracted representation of actual client unit enable status.

In one example, the actual client unit enable status is a list that indicates whether one or more client units are enabled or disabled. In one example, the abstracted representation of actual client unit enable status is a generalization of the list that indicates whether one or more client units are enabled or disabled. In the second example, the power good register 350 presents the abstracted representation of actual client unit enablement status to the accumulation register 240 without exposure to client unit interface details. In the second example, the power good register 350 is a mock register which stores simulated client unit enablement status.

In one example, the permutation sequence is a temporal order of client unit disablement; that is, powering OFF client units. The temporal order of client unit disablement is a reverse order of the temporal order of client unit enablement. In one example, the temporal order of client unit disablement follows the same sequence as described in FIG. 10 with the exception of block 1050, which may be modified to disable (instead of enable) a client unit based on the updated accumulated register state. Thus, for disablement, the step in block 1050 may be to output the updated accumulated register state to a client unit to disable the client unit.

In one aspect, one or more of the steps for providing a permutation sequencer in FIG. 10 may be executed by one or more processors which may include hardware, software, firmware, etc. In one aspect, one or more of the steps in FIG. 10 may be executed by one or more processors which may include hardware, software, firmware, etc. The one or more processors, for example, may be used to execute software or firmware needed to perform the steps in the flow diagram of FIG. 10. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for a permutation sequencer. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for sequencing comprising:
   selecting a current word of a one hot list as a one hot list output;
   comparing the one hot list output with a current accumulation register value of an accumulation register to produce a first logical comparison; and
   inputting the first logical comparison to the accumulation register to generate an updated accumulation register value.

2. The method of claim 1, further comprising outputting the updated accumulated register state to one client unit of a plurality of client units to enable or disable the one client unit.

3. The method of claim 2, wherein a quantity of the plurality of client units is N quantity.

4. The method of claim 3, further comprising creating the one hot list, wherein the one hot list includes N quantity of words.

5. The method of claim 4, wherein each word of the N quantity of words has a word length of N bits.

6. The method of claim 4 wherein each word of the N quantity of words has a word length of less than N bits.

7. The method of claim 6, further comprising encoding each word of the N quantity of words.

8. The method of claim 7, wherein the encoding is binary encoding.

9. The method of claim 2, further comprising generating a second logical comparison between a content of the accumulation register and a content of a power good register.

10. The method of claim 9, wherein the outputting the updated accumulated register state to the one client unit is based on the second logical comparison.

11. An apparatus for sequencing, the apparatus comprising:
    means for creating a one hot list;
    means for selecting a current word of the one hot list as a one hot list output;
    means for comparing the one hot list output with a current accumulation register value of an accumulation register to produce a first logical comparison;
    means for inputting the first logical comparison to the accumulation register to generate an updated accumulation register value; and
    means for outputting the updated accumulated register state to one client unit of a plurality of client units to enable or disable the one client unit.

12. The apparatus of claim 11, wherein a quantity of the plurality of client units is N quantity and wherein the one hot list includes N quantity of words.

13. The apparatus of claim 12, wherein each word of the N quantity of words has a word length of N bits.

14. The apparatus of claim 12, wherein each word of the N quantity of words has a word length of less than N bits and each word is binary encoded.

15. A computer-readable medium storing computer executable code, operable on a device comprising at least one processor and at least one memory coupled to the at least one processor, wherein the at least one processor is configured to implement sequencing, the computer executable code comprising:
    instructions for causing a computer to select a current word of a one hot list as a one hot list output;
    instructions for causing the computer to compare the one hot list output with a current accumulation register value of an accumulation register to produce a first logical comparison; and
    instructions for causing the computer to input the first logical comparison to the accumulation register to generate an updated accumulation register value.

16. The computer-readable medium of claim 15, further comprising instructions for causing the computer to output the updated accumulated register state to one client unit of a plurality of client units to enable or disable the one client unit.

* * * * *